United States Patent
Crisp et al.

(10) Patent No.: US 9,241,420 B2
(45) Date of Patent: *Jan. 19, 2016

(54) IN-PACKAGE FLY-BY SIGNALING

(71) Applicant: Invensas Corporation, San Jose, CA (US)

(72) Inventors: Richard Dewitt Crisp, Hornitos, CA (US); Wael Zohni, San Jose, CA (US); Belgacem Haba, Saratoga, CA (US); Yong Chen, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/275,098

(22) Filed: May 12, 2014

(65) Prior Publication Data

US 2014/0268537 A1  Sep. 18, 2014

Related U.S. Application Data

(63) Continuation of application No. 13/833,278, filed on Mar. 15, 2013, now Pat. No. 8,723,329.

(51) Int. Cl.
*H01L 23/48* (2006.01)
*H01L 23/34* (2006.01)
(Continued)

(52) U.S. Cl.
CPC .............. *H05K 7/1459* (2013.01); *G11C 5/063* (2013.01); *H01L 23/13* (2013.01); *H01L 23/49827* (2013.01); *H01L 23/49838* (2013.01); *H01L 25/0655* (2013.01); *H01L 23/3128* (2013.01);
(Continued)

(58) Field of Classification Search
USPC .................................. 257/691, 734, 773, 774
See application file for complete search history.

(56) References Cited

U.S. PATENT DOCUMENTS

| 5,128,737 A | 7/1992 | van der Have |
| 6,184,121 B1 * | 2/2001 | Buchwalter ......... H01L 21/7682 257/522 |

(Continued)

FOREIGN PATENT DOCUMENTS

| WO | 9116680 A1 | 10/1991 |
| WO | 0005935 A1 | 2/2000 |
| WO | 2013009866 A2 | 1/2013 |

OTHER PUBLICATIONS

International Search Report and Written Opinion for Application No. PCT/US2014/024534 dated Aug. 11, 2014.

(Continued)

*Primary Examiner* — Marc Armand
*Assistant Examiner* — Wilner Jean Baptiste
(74) *Attorney, Agent, or Firm* — Lerner, David, Littenberg, Krumholz & Mentlik, LLP

(57) ABSTRACT

In-package fly-by signaling can be provided in a multi-chip microelectronic package having address lines on a package substrate configured to carry address information to a first connection region on the substrate having a first delay from terminals of the package, and the address lines being configured to carry the address information beyond the first connection region to at least to a second connection region having a second delay from the terminals that is greater than the first delay. Address inputs of a first microelectronic element, e.g., semiconductor chip, can be coupled with each of the address lines at the first connection region, and address inputs of a second microelectronic element can be coupled with each of the address lines at the second connection region.

20 Claims, 14 Drawing Sheets

(51) Int. Cl.
*H01L 21/70* (2006.01)
*H05K 7/14* (2006.01)
*H01L 23/13* (2006.01)
*H01L 25/065* (2006.01)
*G11C 5/06* (2006.01)
*H01L 23/498* (2006.01)
*H01L 23/31* (2006.01)

(52) U.S. Cl.
CPC ... *H01L 23/49816* (2013.01); *H01L 2224/4824* (2013.01); *H01L 2924/15311* (2013.01)

(56) References Cited

U.S. PATENT DOCUMENTS

| | | | |
|---|---|---|---|
| 6,784,026 | B2 | 8/2004 | Parks |
| 8,723,329 | B1 * | 5/2014 | Crisp et al. ............... 257/774 |
| 2005/0024963 | A1 | 2/2005 | Jakobs et al. |
| 2007/0070669 | A1 | 3/2007 | Tsern |
| 2008/0253216 | A1 | 10/2008 | Ko |
| 2010/0091537 | A1 | 4/2010 | Best et al. |
| 2010/0218072 | A1 | 8/2010 | Fukuyama et al. |
| 2011/0096602 | A1 * | 4/2011 | Kim .................. G11C 16/34 365/185.11 |
| 2012/0182776 | A1 | 7/2012 | Best et al. |

OTHER PUBLICATIONS

Second International Written Opinion for Application No. PCT/US2014/024534 dated Mar. 24, 2015.

Cheng-Kuan Chen et al: "Signal integrity analysis of DDR3 highspeed memory module", Advanced Packaging and Systems Symposium, 2008. EDAPS 2008. Electrical Design of, IEEE, Piscataway, NJ, USA, Dec. 10, 2008, pp. 101-104, XP031384981.

Taiwanese Office Action for Application No. 103107565 dated Oct. 7, 2015.

* cited by examiner

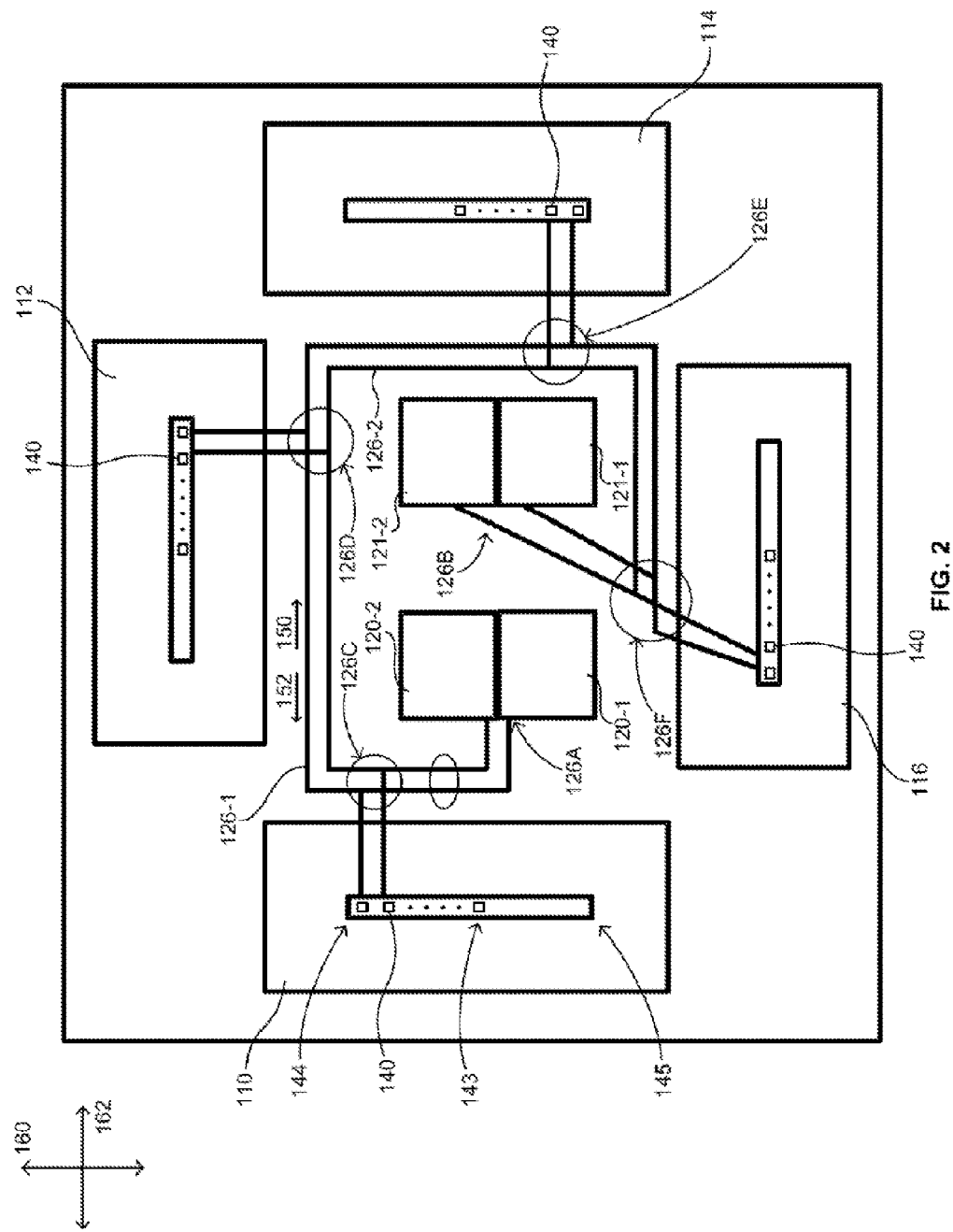

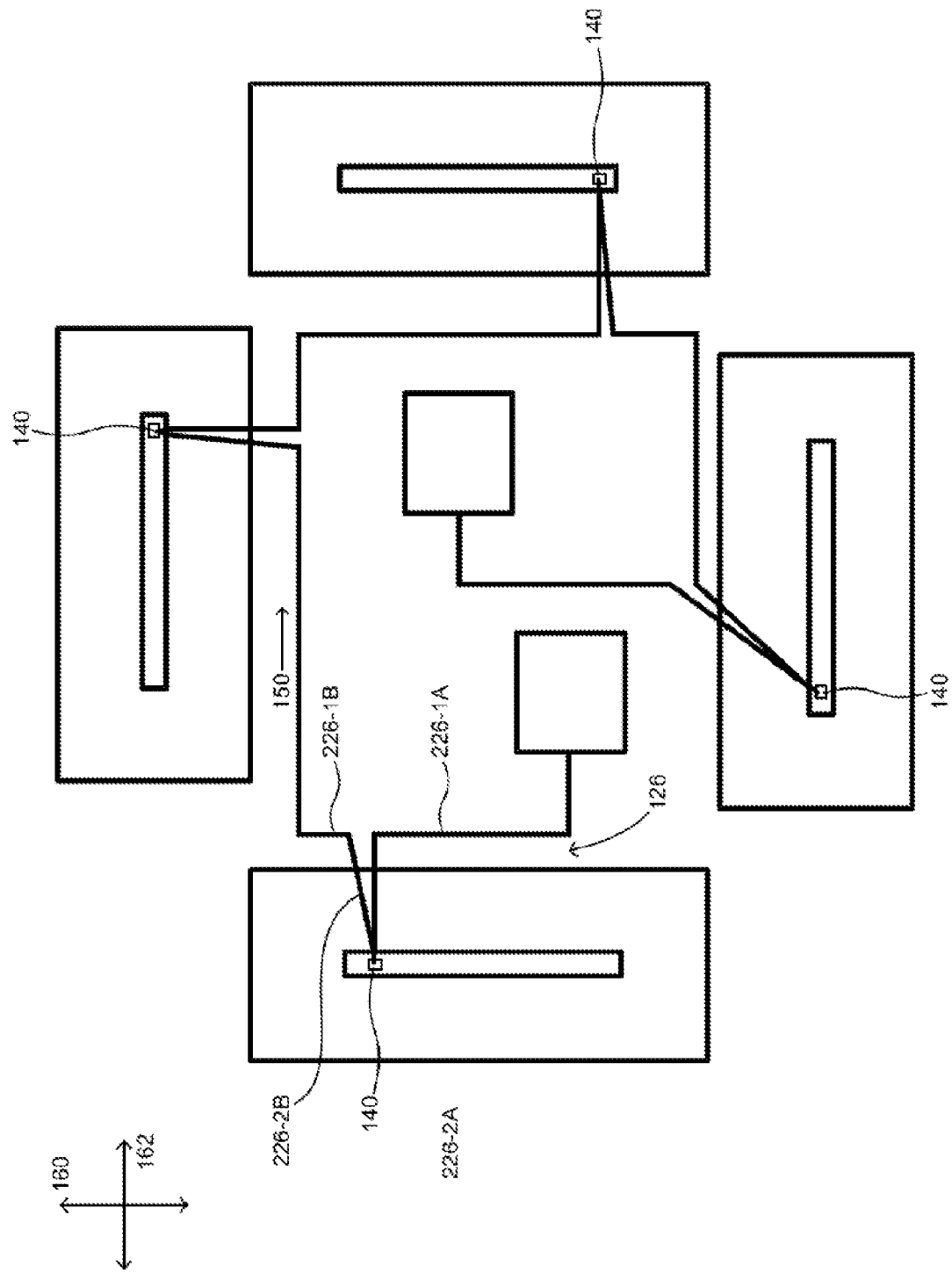

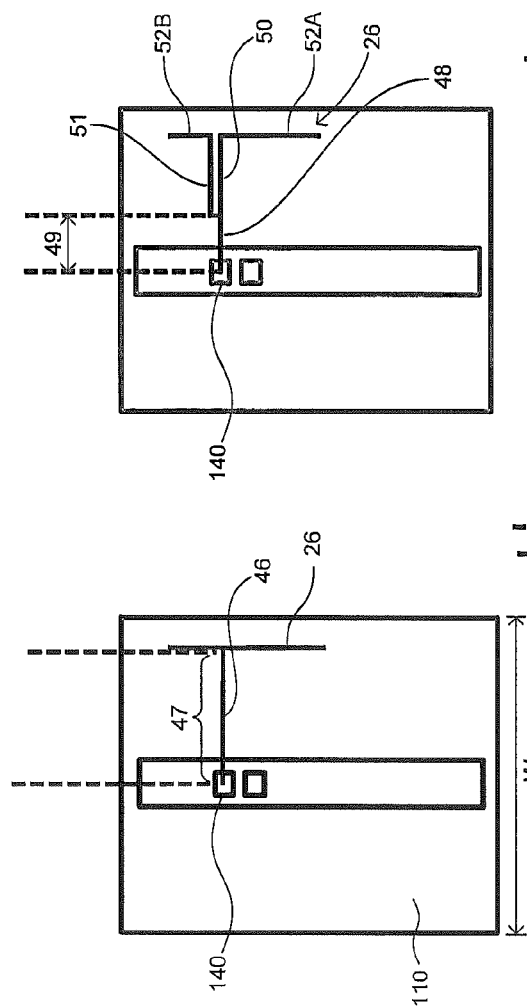
FIG. 6A
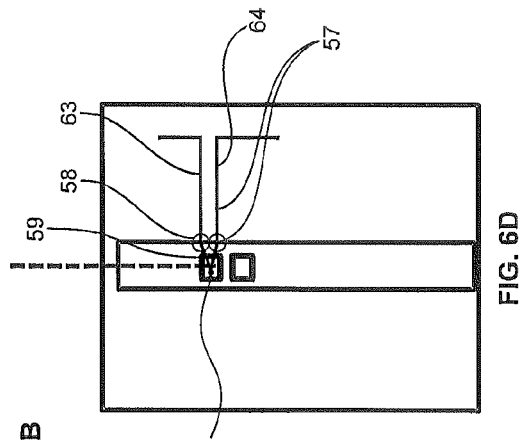
FIG. 6B
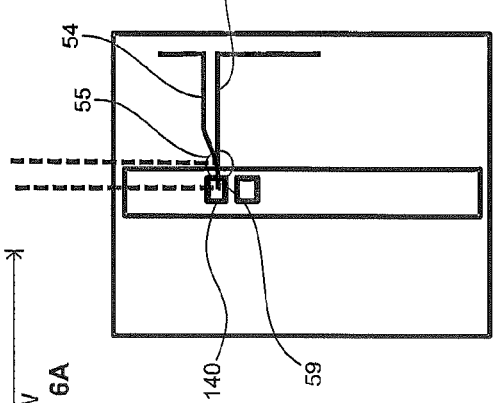
FIG. 6C
FIG. 6D

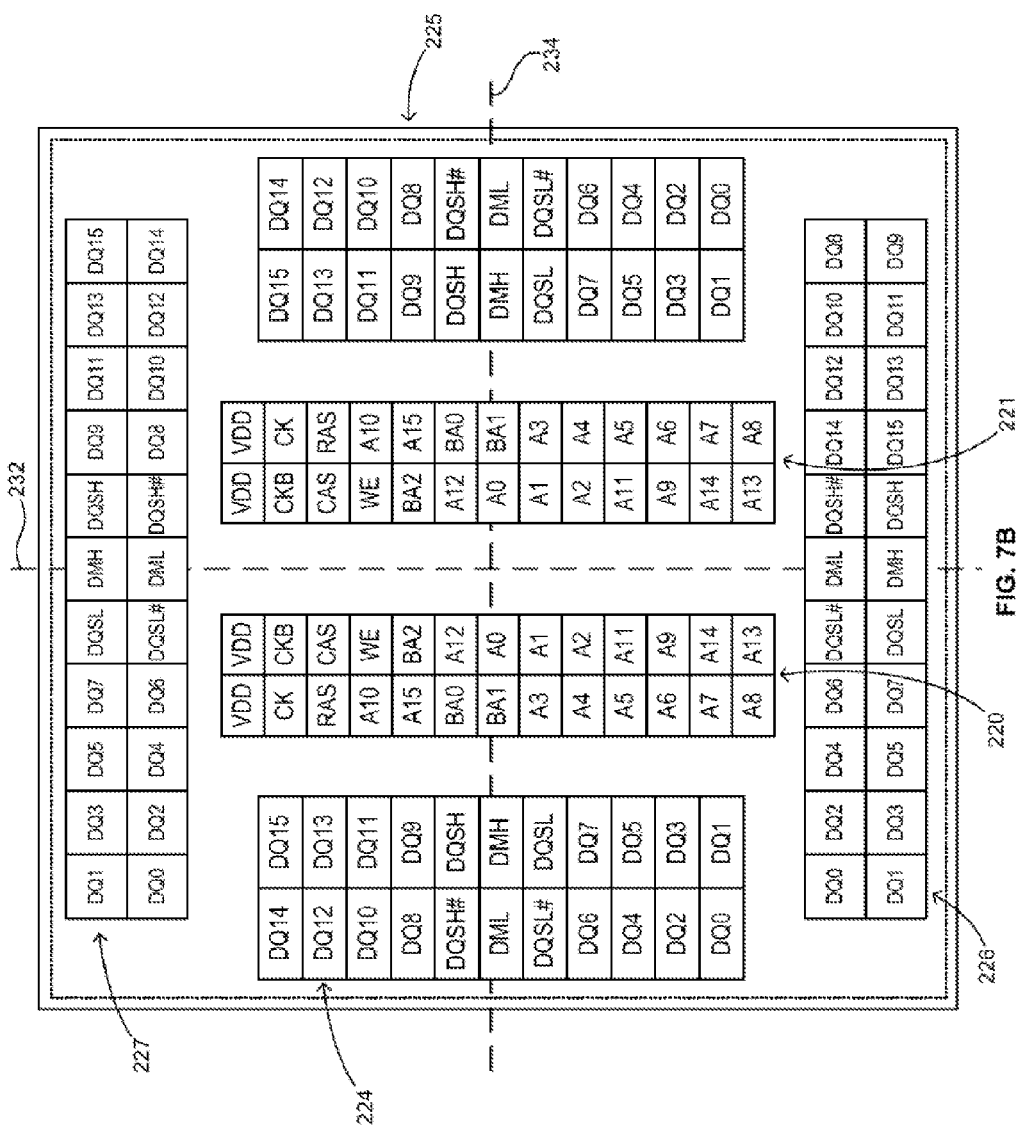

IN-PACKAGE FLY-BY SIGNALING

CROSS-REFERENCE TO RELATED APPLICATIONS

The present application is a continuation of U.S. patent application Ser. No. 13/833,278, filed Mar. 15, 2013, the disclosure of which is incorporated herein by reference.

BACKGROUND OF THE INVENTION

1. Field of the Invention

The subject matter of the present application relates to microelectronic packaging, and more specifically to multi-chip microelectronic memory packages, such as which include multiple dynamic random access memory ("DRAM") chips in the same package.

2. Description of the Related Art

Microelectronic elements generally comprise a thin slab of a semiconductor material, such as silicon or gallium arsenide, commonly called a die or a semiconductor chip. Semiconductor chips are commonly provided as individual, packaged units in form of microelectronic packages. In some designs, the semiconductor chip is mounted to a substrate or chip carrier, which is in turn mounted on a circuit panel, such as a printed circuit board.

The active circuitry is fabricated in a first face of the semiconductor chip (e.g., a front face or surface). To facilitate electrical connection to the active circuitry, the chip is provided with bond pads on the same face. The bond pads are typically placed in a regular array either around the edges of the die or, for many memory chips, in the die center. The bond pads are generally made of a conductive metal, such as copper, or aluminum, around 0.5 micron (μm) thick. The bond pads could include a single layer or multiple layers of metal. The size of the bond pads will vary with the specific type of chip but will typically measure tens to hundreds of microns on a side.

Size is a significant consideration in any physical arrangement of chips. The demand for more compact physical arrangements of chips has become even more intense with the rapid progress of portable electronic devices. Merely by way of example, devices commonly referred to as "smart phones" and "tablet computers" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The components which form the interconnections should not greatly increase the size of the assembly. Similar needs arise in other applications as, for example, in data servers such as those used in internet search engines. For example, structures which provide numerous short, interconnects between complex chips can increase the bandwidth of the search engine and reduce its power consumption.

In view of the foregoing, it can be advantageous to assemble multiple chips, particularly memory chips such as DRAMs in multi-chip memory packages. Further improvements can be made to the structure and function of multi-chip memory packages.

BRIEF SUMMARY OF THE INVENTION

A microelectronic package according to an aspect of the invention can include a package substrate having a plurality of first terminals for connection with a component external to the package, such first terminals being configured to carry address information. The package can include first and second microelectronic elements each having a face facing a first surface of the substrate. Each microelectronic element can include a memory storage array, and each microelectronic element may have address inputs for receipt of address information specifying locations within the memory storage array of the respective microelectronic element.

The package substrate may have a plurality of address lines coupled with the first terminals and configured to carry address information to a first connection region on the substrate, the first connection region having a first delay from the first terminals. The address lines can be configured to carry the address information beyond the first connection region at least to a second connection region on the substrate having a second delay from the first terminals. The address inputs of the first microelectronic element can be coupled with each of the address lines at the first connection region, and the address inputs of the second microelectronic element can be coupled with each of the address lines at the second connection region, and the second delay can be greater than the first delay.

In one or more examples, the substrate can have a second surface opposite the first surface, wherein the terminals can be at the second surface of the substrate.

In one or more examples, distances between the address inputs and the address lines to which each address input can be coupled at the respective connection region can be less than two millimeters.

In one or more examples, the package substrate may further comprise second terminals electrically coupled with the first terminals through the address lines. The address lines can be configured to carry the address information beyond the second connection region towards the second terminals.

In one or more examples, a microelectronic assembly may include the microelectronic package as claimed in claim 1, and an additional component, the component having a plurality of contacts connected with the first terminals of the microelectronic package and the component including drivers configured to drive the address information.

In one or more examples, the second terminals can be configured to connect with corresponding second contacts of a component, whereby in a state of such connection the second contacts can couple the second terminals with corresponding termination circuits external to the microelectronic package.

In one or more examples, the first delay along the address lines in a first electrical path direction can be the same as a third delay along the address lines in a second electrical path direction from the second terminals to the second connection region.

In one or more examples, the address inputs of the first microelectronic element can be disposed at positions within a row extending in a first direction, wherein first segments of the address lines adjacent to the first microelectronic element extend in the first direction.

In one or more examples, at least some of the first segments may overlie the face of the first microelectronic element.

In one or more examples, second segments of the address lines can extend in a second direction away from such first segments towards the address inputs of the first microelectronic element. In a particular example, each second segment may have length less than half a width of the microelectronic element.

In one or more examples, distances between the address inputs and the respective first segments to which each address input is coupled at the respective connection region can be less than two millimeters.

In one or more examples, at least some parts of the second segments overlie the face of a given microelectronic element of the first and second microelectronic elements. The at least some parts may include wire bonds electrically connected to a given contact at the face of the given microelectronic element and be coupled with an address line of the plurality of address lines.

In one or more examples, at least some parts of the second segments overlie the face of a given microelectronic element of the first and second microelectronic elements and the at least some parts include electrically substrate contacts facing and joined to respective ones of the contacts of the given microelectronic element.

In one or more examples, the first and second microelectronic elements can be spaced apart from one another in a direction parallel to the first surface.

In one or more examples, faces of the first and second microelectronic elements at which the address inputs are provided, respectively, can be arranged in a single plane.

In one or more examples, A system can include a microelectronic package as described above, and may include a circuit panel having contacts electrically connected with the first terminals.

In one or more examples, the system may further include a housing. In one or more examples, at least one of the microelectronic package or the circuit panel can be mounted with or mounted to the housing.

In one or more examples, a microelectronic package can further include third and fourth microelectronic elements each including a memory storage array and having address inputs for receipt of address information specifying locations within the memory storage array of the respective microelectronic element and each having a face confronting the first surface, In such case, the address lines can further have a third connection region having a third delay from the first terminals and a fourth connection region having a fourth delay from the first terminals. The address lines can be configured to carry the address information beyond the second connection region to a third connection region and can be configured to carry the address information beyond the third connection region to the fourth connection region. The address inputs of the third microelectronic element can be coupled with each of the address lines at the third connection region, and the address inputs of the fourth microelectronic element can be coupled with each of the address lines at the fourth connection region. In such case, the fourth delay can be greater than the third delay, the third delay can be greater than the second delay, and the second delay can be greater than the first delay.

In one or more examples, the package substrate may further comprises second terminals electrically coupled with the first terminals through the address lines. In such case, the address lines can be configured to carry the address information beyond the second connection region towards the second terminals.

A microelectronic package according to an aspect of the invention can include a package substrate having first and second oppositely facing surfaces, a plurality of first terminals and a plurality of second terminals. The first terminals and the second terminals can be at the second surface of the package substrate and can be configured to carry address information and can be configured to connect with a component external to the microelectronic package.

In such microelectronic package, the first terminals can include first and second groups thereof, and the second terminals can include first and second groups thereof. The first group of first terminals can be coupled with the first group of second terminals, and the second group of first terminals can be coupled with the second group of second terminals.

In such microelectronic package, first, second, third, and fourth microelectronic elements may each have a face facing towards a first surface of the substrate. Each microelectronic element can incorporate a memory storage array, and each microelectronic element may have address inputs for receipt of address information specifying locations within the memory storage array of the respective microelectronic element. In such microelectronic package, the first and second microelectronic elements can be coupled with the first group of first terminals, and the third and fourth microelectronic elements can be coupled with the second group of first terminals.

In one or more examples, the package substrate can have a first group of address lines and a second group of address lines thereon, wherein the first group of first terminals can be coupled with the first group of second terminals through the first group of address lines, and the second group of first terminals can be coupled with the second group of second terminals through the second group of address lines.

In one or more examples, the first and second microelectronic elements can be configured to sample signals on the first and second sets of address lines no more than once per clock cycle.

In one or more examples, the first and second microelectronic elements can be configured to sample signals on the first and second sets of address lines at least twice per clock cycle during at least some clock cycles.

In one or more examples, the address lines can extend to areas overlying faces of the first, second, third and fourth microelectronic elements.

In one or more examples, the first, second, third and fourth microelectronic elements can be spaced apart from one another in at least one direction parallel to the first surface.

In one or more examples, faces of the first, second, third and fourth microelectronic elements at which the address inputs are provided, respectively, can be arranged in a single plane.

In one or more examples, the substrate can have a second surface opposite the first surface, and the terminals can be at the second surface of the substrate.

In one or more examples, distances between the address inputs and the address lines to which each address input is coupled at the respective connection region can be less than two millimeters.

In one or more examples, a system can include a microelectronic package as described above and can further comprise a circuit panel having contacts electrically connected with the first terminals. A housing may be provided to which or within which such circuit panel may be housed on mounted.

BRIEF DESCRIPTION OF THE SEVERAL VIEWS OF THE DRAWINGS

FIG. 2 is a simplified schematic block diagram further illustrating a multi-chip microelectronic package according to the embodiment of the invention also seen in FIGS. 1A-1C;

FIG. 5 is a plan diagram illustrating a possible arrangement of address lines in a multi-chip microelectronic package according to a variation of an embodiment of the invention seen in FIGS. 1A-1C and 2;

FIGS. 6A, 6B, 6C and 6D are partial fragmentary views further illustrating particular arrangements of address lines in multi-chip microelectronic packages according to embodiments of the invention;

FIG. 7B is a schematic plan diagram illustrating a possible arrangement of terminals on a multi-chip package, such as may also be used in an embodiment as seen in FIG. 7A;

DETAILED DESCRIPTION OF THE INVENTION

Figure 1A:
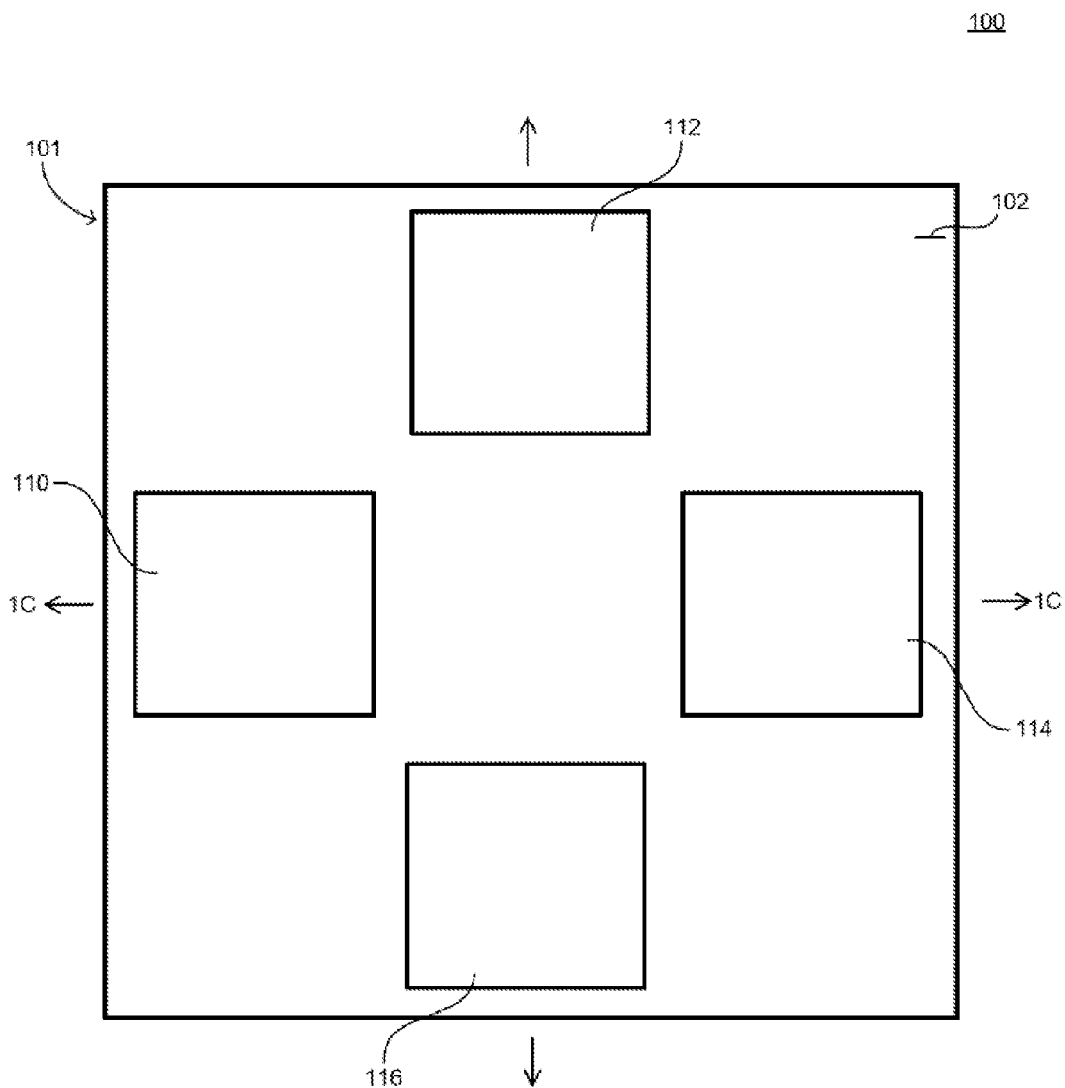
FIG. 1A is a top plan view of a multi-chip microelectronic package according to an embodiment of the invention.

In support of the aforementioned goals of increasing data bandwidth and speed, and to some extent, reducing size, multiple microelectronic elements such as semiconductor chips can be assembled together in one common microelectronic package having at least some common terminals coupled to multiple chips for connecting the package with corresponding contacts of another component such as a circuit panel or board. However, particular challenges are emerging with increased operating speeds and data transfer rates in systems such as the above-discussed computers and other processor-enabled devices, where loading onto common signaling busses such as a command-address bus can affect the signaling speed and thereby impact system performance. Embodiments of the invention described herein can help to reduce loading onto a common signaling bus such as an address bus or command-address bus by reducing lengths of connections between individual microelectronic elements and the bus. In examples provided herein, multi-chip packages are provided in which address information and typically also command information are routed on a bus extending on a substrate of the package that supports the multiple chips of the package, each chip being coupled to the bus at a respective connection region through which the bus extends.

In the description which follows, a statement that two or more electrically conductive features are "electrically connected," "coupled," "electrically coupled" or have an "electrical connection," or the like, unless otherwise qualified, shall mean the two features are electrically coupled to permit a flow of alternating electric current ("AC current") between the two features, and possibly to permit a flow of direct current ("DC current") between the two features, whether or not there is a direct physical connection shared by the two features.

A microelectronic package is provided in accordance with an embodiment of the invention in which at least first and second microelectronic elements, e.g., semiconductor chips, are combined in a single microelectronic package having a set of common address lines on a package substrate. In examples, the package substrate can have a dielectric element of polymeric material or a combination of polymeric and inorganic dielectric material such as polyimide, epoxies, glass-epoxy material, e.g., "FR-4,", BT (bismaleimide triazine) resin, etc., or may have other inorganic component materials such as glass or ceramic material. Such package substrate may typically have a thickness in a direction normal to the faces of the chips from a few tens of micrometers to a few hundred micrometers. The address lines are configured to couple address information received on first terminals of the assembly to the first and second microelectronic elements with first and second respective delays along the common address lines relative to the first terminals. As used herein, a statement that conductive structure such as conductive pads, traces, interconnects, and particularly, address lines as provided herein are "on" a component, e.g., a package substrate or chip carrier, interposer, circuit panel, among others, means that such pad, trace, interconnect, etc., is mechanically supported directly by the interconnection component, whether the conductive structure is at an exposed surface of the interconnection component per the above definition, or is partially embedded within the interconnection component or fully embedded within the interconnection component below the exposed surface.

Illustratively, the microelectronic package may be a surface-mount technology ("SMT") package having the terminals such as a land grid array, ball grid array, or any number of other suitable terminals which can be used to mount the terminals to corresponding contacts of a circuit panel, e.g., motherboard, subsystem board, module circuit panel or card, flexible circuit panel, etc., where the module circuit panel can have further terminals for connection with another circuit panel of a system in which the module is used.

Figure 1B:
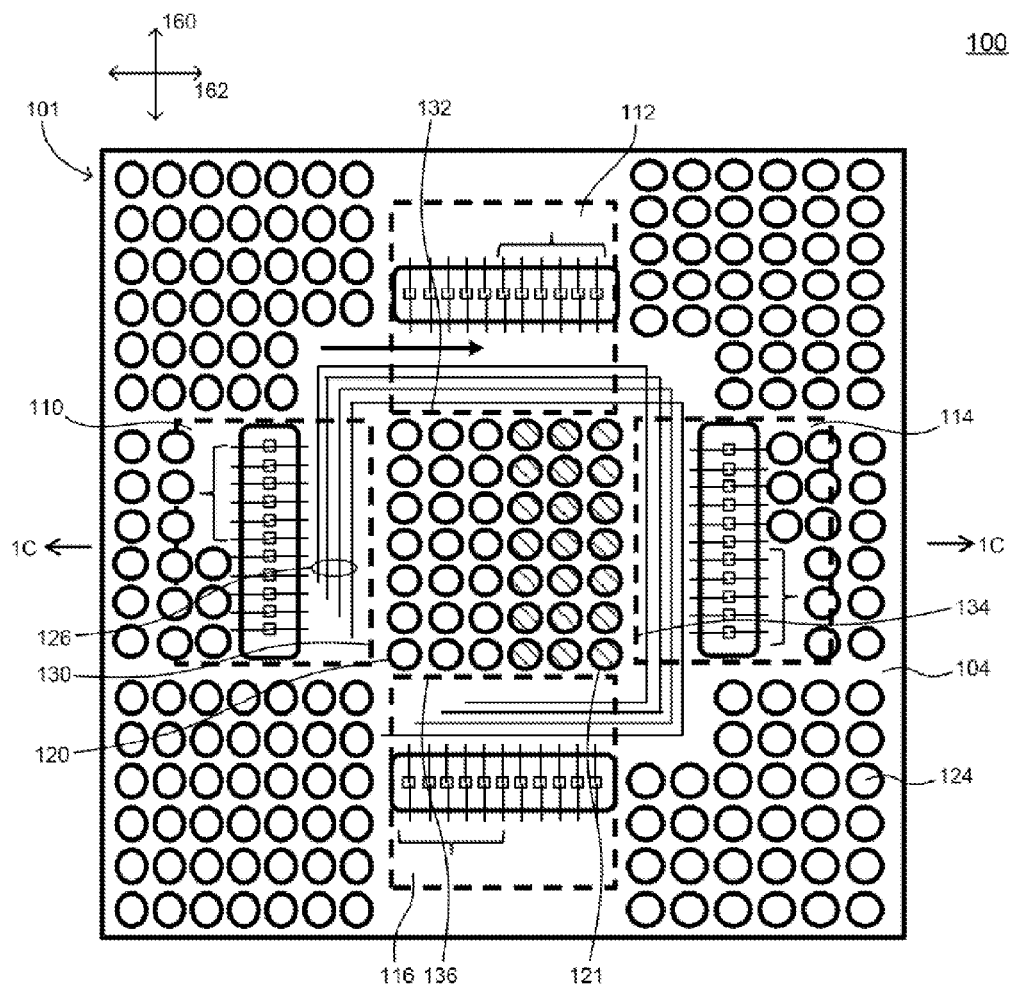
FIG. 1B is a bottom plan view of the multi-chip microelectronic package according to the embodiment of the invention also seen in FIG. 1A.
Figure 1C:
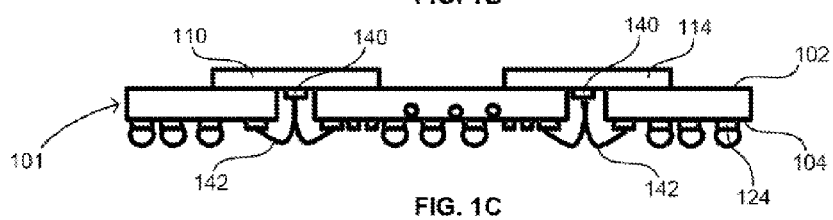
FIG. 1C is a sectional view through line 1C-1C of FIG. 1B of the multi-chip microelectronic package according to the embodiment of the invention also seen in FIGS. 1A-1B.

FIGS. 1A, 1B and 1C illustrate a microelectronic package 100 according to an embodiment of the invention. As seen in FIG. 1A, the microelectronic package includes a plurality of microelectronic elements 110, 112, 114, and 116, of which each can be a bare semiconductor chip in one example. Typically, each microelectronic element includes a memory storage array, and may be a type of semiconductor chip in which memory storage array function is a primary function thereof. Particular examples of such microelectronic elements are or include dynamic random access memory ("DRAM") chips. Common examples of such memory chips are those which conform to a JEDEC specification for double-data rate ("DDR") version 3, version 4, and preceding and follow-on generations, and those which conform to a JEDEC specification for low-power double-data rate ("LPDDR") version 3 (hereinafter, "LPDDRx") and preceding and follow-on generations, graphics double-data rate ("GDDRx") and preceding and follow-on generations.

As seen in FIGS. 1A, 1B and 1C, the microelectronic elements have contacts 140 at faces of the microelectronic elements which confront a surface 102 of the substrate, the contacts 140 being coupled to terminals 120, 121, 124 of the substrate through leads which may be wire bonds 142 or which may be integral with traces extending along the substrate 101. As used herein with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate. The contacts 140 include those which function as address inputs of the microelectronic element at which address information can be received or input to the microelectronic element. The contacts 140 also include data contacts through which data is input or output to the microelectronic element, or more commonly which can be input and output through the same data contacts. Other contacts 140 can be used for coupling the package 100 to clock signals, command signals such as write enable, row address strobe, column address strobe, power and ground, and possibly multiple power and ground references, among others.

In another example, a microelectronic element can be a semiconductor chip having one or more additional wiring layers extending along a face of such chip connected with contacts of the chip in another example.

In FIGS. 1A, 1B, 1C, the directions parallel to the first surface 102 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

As further seen in FIGS. 1B-1C, the package 100 may have a plurality of terminals 120, 121, 124 at an oppositely-facing surface 104 of the package from surface 102. As shown in FIG. 1B, the terminals can be disposed in an area array having more than three rows of terminals extending in the same direction parallel to the surface 104 of the substrate, i.e., in directions such as a "vertical" package layout direction 160 parallel to surface 104 or a "horizontal" package layout direction 162. In one example, the terminals may be any type of terminals, such as those described in the foregoing. The terminals include a set of first terminals 120 and a set of second terminals 121 which may be disposed mainly or entirely within a central region of the surface 104 that lies between adjacent and nearest edges 130, 132, 134, 136 of the microelectronic elements 110, 112, 114, 116, respectively. In one example, the first and second terminals can be configured to carry address information, e.g., which may be coupled to address inputs of the chips within the package and which may be utilized to specify a location within a memory storage array of the two or more chips within the package. Third terminals 124, which are disposed beyond a central region of the substrate, can include terminals for carrying data in one or more directions to or from the microelectronic elements, and which can include terminals coupled to various contacts on the microelectronic elements, such as for example, for connection to power and ground.

In one example, the first terminals and the second terminals can be coupled to a set of address lines 126 as seen in FIG. 1C. As used herein, "set of address lines" means a set of conductive elements on the substrate such as traces and interconnects that together can be used to route address information from terminals and each of at least first and second connection regions on the substrate where first and second microelectronic elements are coupled to address lines. In some cases, the "address lines" can be configured to carry the address information and in addition, command information such as the aforementioned WE, RAS and CAS information or signals to corresponding contacts 140 of the microelectronic elements. FIG. 2 illustrates principles of interconnection which support an in-package "fly-by" signaling configuration in a drawing that can have been simplified for ease of explanation and illustration. In the example seen in FIGS. 1A, 1B, 1C and 2, the address lines are configured to carry address information to the microelectronic elements 110, 112, 114, 116 in the package. With further reference to FIG. 2, in one example, the package can be configured such that the first terminals 120-1, 120-2 are coupled to the address lines 126-1, 126-2, respectively, at a first region 126A thereof which is remote from a second region 126B of the address lines at which the second terminals are coupled to the address lines 126-1, 126-2. Two or more connection regions at which microelectronic elements are coupled to the address lines (illustratively, 126C, 126D, 126E, and 126F) are disposed between the first connection region and beyond the second region. The address lines 126 provide signal paths from the first terminals in a first path direction 150 through the two or more connection region, or in a second path direction 152 opposite the first path direction from the second terminals through the two or more connection region to the first terminals. As will be explained further below in additional examples, the direction 150, 152 in which the address information flows within the package can depend upon the configuration in which the microelectronic package is assembled with other elements in a higher level assembly such as on a circuit panel or in a system.

In the examples provided in FIGS. 1A, 1B and 1C and 2, address information is configured to be transferred along address lines 126 between the first terminals 120, and the second terminals 121 through each of connection regions 126C, 126D, 126E, and 126F, where the address information is coupled to first, second, third and fourth microelectronic elements, respectively. The flow of address information along the address lines within the package is along segments of the address lines which extend in the same direction in which a row of contacts 140 on each respective microelectronic element extends. For example, segments of the address lines which include connection region 126C extend in a vertical package layout direction 160 which is parallel to a direction in which a row of contacts 140 on the microelectronic element 110 extends. In addition, segments of the address lines which include connection region 126D extend in a horizontal package layout direction 162 which is parallel to a direction in which a row of contacts 140 on the microelectronic element 112 extends. This relationship is also true for segments of the address lines which include connection region 126E which extend in a vertical package layout direction 160 parallel to a row of contacts 140 of microelectronic element 114, and is also true for segments of the address lines which include connection region 126F which extend in a horizontal package layout direction being parallel to a row of contacts 140 of microelectronic element 116.

In a particular example as further seen in FIG. 1B, the address lines 126 can overlie the faces of one or more of the microelectronic elements 110, 112, 114, 116 in package 100. In the example of FIG. 1B, at least some address lines 126 overlie microelectronic elements 110, 112, 114, 116, which may be the same address lines 126 overlying each microelectronic element, or in some cases, different ones of a common set of address lines 126 may overlie each microelectronic element.

Referring to FIG. 2, each connection region 126C, 126D, 126E, and 126F can have a respective delay along the address lines determined relative to the first terminals 120 of the package 100. As used herein, with respect to a signal line such as an address line within an assembly such as on a package substrate within a package, "delay" refers to an electrical path length along the signal line. Thus, the connection region 126C can have a first delay relative to the first terminals 120, and the connection region 126D can have a second delay relative to the first terminals 120, the second delay being greater than the first delay. One characteristic that can be achieved in accordance with an embodiment as seen in FIGS. 1A-1C and 2 is to provide in-package fly-by address signaling, in that a difference between the first and second delays along the address lines is greater than a difference in the delay along the address lines between the first terminals and any two address inputs of the first microelectronic element, or for example, between the first terminals and any two address inputs of the second microelectronic element. As further seen in FIG. 2, contacts 140 on each microelectronic element which are configured to receive the address information typically are disposed between a center 143 of the row of contacts and a first end 144 of the row adjacent a peripheral edge of the microelectronic element, and are not disposed between the center 143 and a second end 145 of the row opposite the first end 144.

Figure 3:
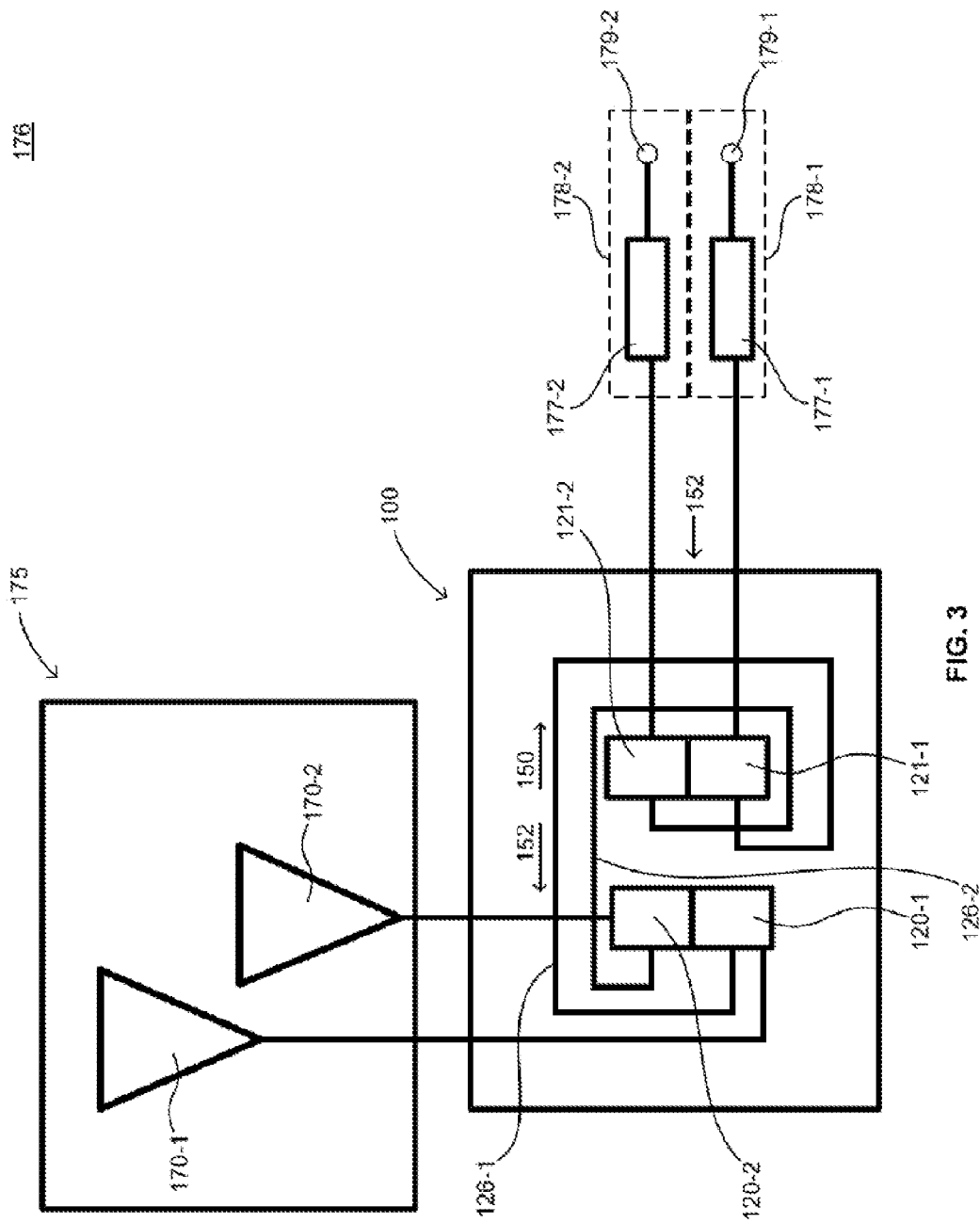
FIG. 3 is a schematic block diagram illustrating a multi-chip microelectronic package in accordance with an embodiment of the invention as further interconnected in a system.

FIG. 3 provides a specific example of an interconnection of package 100 within a system 176 which includes additional circuit elements. As seen in FIG. 3, drivers 170-1, 170-2 which can be elements of one or more components 175 external to the package 100, can be configured to transmit address information to respective first terminals 120-1 and 120-2 of the package 100. In particular examples, the drivers 170-1 and 170-2 can be elements of a component 175 which is or which includes a microprocessor or microcontroller, the drivers 170-1 and 170-2 being configured to drive the address information along respective paths 172-1 and 172-2 on a component external to the package to the first terminals 120-1 and 120-2, respectively. That address information can be received at the first terminals 120-1 and 120-2 and then carried by respective address lines 126-1 and 126-2 of the package 100 to microelectronic elements 110, 112, 114, 116 (FIGS. 1A-1C and 2) as described above.

As further seen in FIG. 3, second terminals 121-1 and 121-2 of the package 100 are coupled with respective address lines 126-1 and 126-2. As installed in system 176, the second terminals 121-1 and 121-2 can be coupled with respective termination circuits 178-1 and 178-2 external to the package 100. Illustratively, the termination circuits can include respective termination resistors or resistance circuits 177-1, 177-2, which are coupled to respective sources of reference potential 179-1, 179-2, each of which can be a power or ground reference of the system, or a circuit configured to apply a source of reference potential, for example. Other termination circuit arrangements are possible within the scope of that contemplated in accordance with this embodiment, and all such termination circuit arrangements are considered to be applicable unless otherwise noted. Thus, in such arrangement shown in FIG. 3, address information can be driven by drivers 170-1, 170-2 external to the package 100 to respective first terminals 120-1 and 120-2, and then coupled onto address lines 126-1, 126-2 on the package substrate, where the address information is then routed to each respective connection region of the package 100 in sequence, for example, as routed to connection region 126C (FIG. 2), then to connection region 126D, then to connection region 126E, and then to connection region 126F, at which connection regions the address information is coupled to the respective microelectronic elements, for example, to microelectronic elements 110, 112, 114 and 116. In the embodiment seen in FIG. 3, after reaching connection region 126F, the address information exits the package 100 at second terminals 121-1 and 122-2 and termination circuits 178-1 and 178-2 coupled to the second terminals, respectively, provide termination for the respective address lines 126-1 and 126-2 of the package 100 so as to reduce or eliminate unwanted reflections of the address information from propagating in an electrical path direction 152 opposite the primary electrical path direction 150 in which address information is configured to flow within the package 100.

Figure 4A:
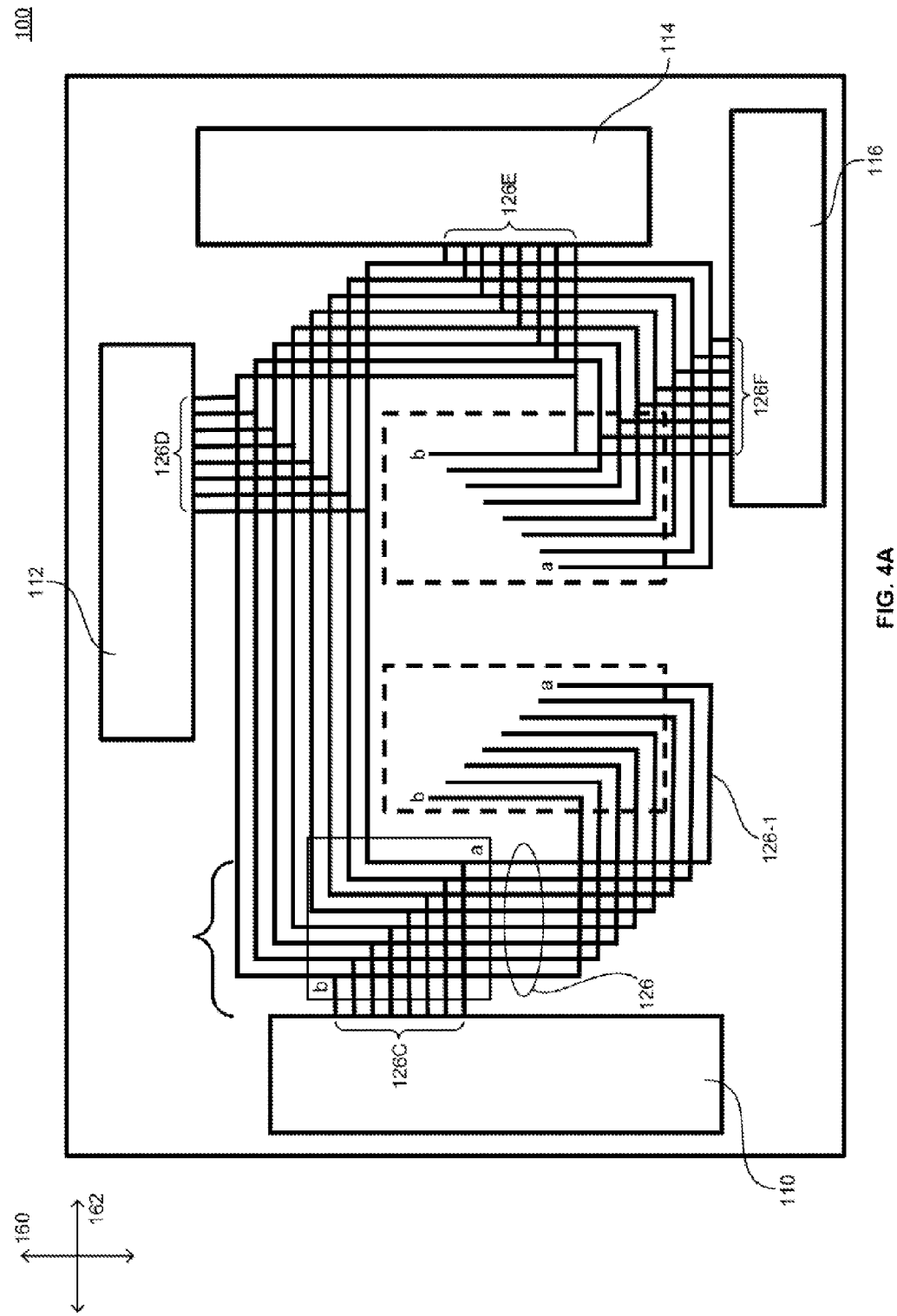
FIGS. 4A and 4B are plan diagrams further illustrating a possible arrangement of address lines and terminals in a multi-chip microelectronic package in accordance with an embodiment of the invention.
Figure 4B:
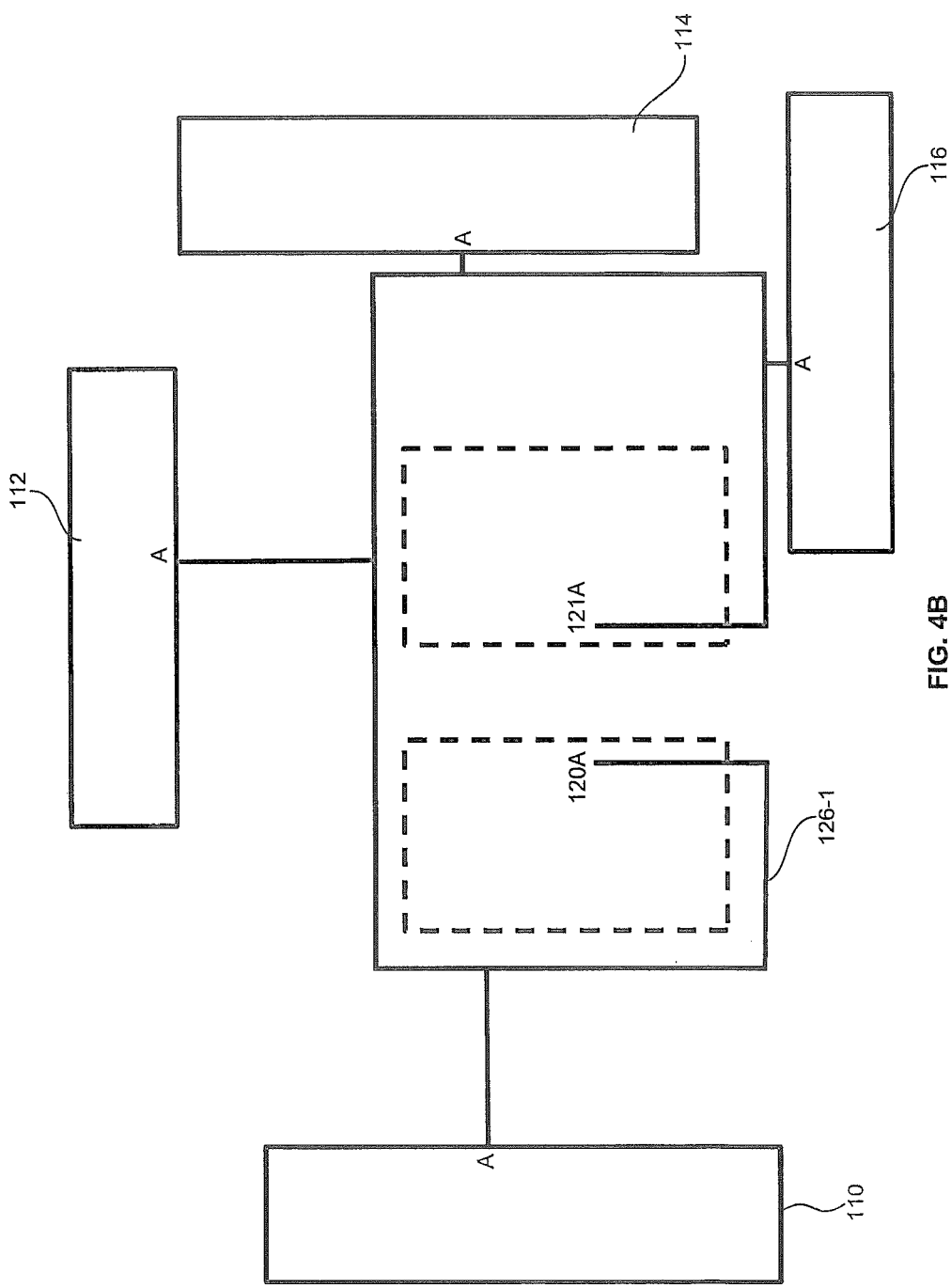

FIG. 4A illustrates a possible arrangement of address lines within microelectronic package 100. As seen therein, the delays along each of the address lines 126 to a connection region such as connection region 126C can be controlled by matching of the lengths of traces and other conductors on the package substrate. In such configuration, the largest relative delay between any contacts 140 (FIG. 2) which are address inputs of each microelectronic element can be controlled within an acceptable tolerance based on the cycle time selected for operation of the microelectronic package. Thus, in one example, the longest relative delay seen at contacts 140 of one microelectronic element between the address information received at one such contact 140 and another contact 140 thereof can be a fraction of one half of one clock cycle at which the microelectronic package 100 is configured to operate at the highest rated available speed. Under such conditions, the relative delay within such tolerance of the address information arriving at contacts 140 of one microelectronic element can be referred to herein as "no delay." In a specific example as seen in FIG. 4A, a set of eight address lines arranged in order from "a" to "b" route address information thereon starting with a first connection region 126C, then in sequence to connection regions 126D, 126E, and 126F, as discussed above. As seen in FIG. 4B, which represents a simplified version of FIG. 4A showing a single address line referred to as line "126-1", the electrical path of the address line from a first terminal referenced as "120a" to a second terminal referenced as "121a" can have trace lengths in each of the vertical and horizontal package layout directions 160, 162, which can be relatively uniform among each of the address lines 126 (FIG. 4A) of the package. By following the exemplary electrical paths of the address lines 126 shown in FIG. 4A through the connection regions 126C, 126D, etc., it can be seen that each address line, for example, address line 126-1 can extend in the vertical package layout direction 160 and the horizontal package layout direction 162.

Thus, by comparison between the address line 126-1 shown in FIG. 4B and each other of the address lines 126 shown in FIG. 4A, it can be seen that each segment of each address line can be shifted in both the vertical and horizontal package layout directions 160, 162 (FIG. 2) as one way of helping to provide the same electrical path lengths along the address lines from the first terminals to the second terminals.

Electrical interconnections between address lines 126 and each microelectronic element 110, 112, 114, 116 can be provided in a variety of ways. Since the address lines 126 on the package substrate represent a bus which provides the address information to each microelectronic element 110, 112, 114, 116 of the package, it is beneficial to reduce loading on the address lines. Specifically, it is advantageous to reduce the lengths of stubs extending away from the address lines 126, such as which couple the address lines to contacts 140 on each microelectronic element. One way that the stub lengths can be reduced is for some or all of the address lines 126 to overlie the faces of the microelectronic elements at which the contacts 140 are disposed, as discussed above relative to FIG. 1B.

Referring to FIG. 5, another way of reducing stub lengths is to insert jogs in the address lines 126 such that a second segment of the respective address line extends in a direction away from a first segment with which it is coupled, e.g., segment 226-1 of the address line, towards a contact 140 such that the length of a stub coupling the second segment with the contact 140 is made shorter. As seen in FIG. 5, even when first segment 226-1 of address line 126 extends in a direction 160 parallel to the row of contacts 140 of the nearest microelectronic element, such segment may not overlie the face of the microelectronic element. A second segment 226-2A extends in a direction between the first segment and a contact 140 to which it is coupled, and another second segment 226-2B extends in a direction between the contact 140 to which it is coupled and a first segment 226-1B of the address line to which segment 226-2B is coupled.

FIGS. 6A, 6B, 6C and 6D illustrate further examples of structures by which lengths of stubs between the address lines and the contacts of a microelectronic element can be reduced. Thus, FIG. 6A illustrates a stub 46 having length 47 between the address line 26 which is less than half a width W of a microelectronic element 110 to which the stub 46 is coupled. However, the flow of address information to the contact 140 in FIG. 6A is from address line 26, then through stub 46 to contact 140. FIG. 6B illustrates an example in which the length 49 of the stub 48 can have been reduced significantly by inserting jogs 50, 51 into the address line which extend in directions between first segments 52A, 52B of the address line and the contact 140. The jogs 50, 51 can represent traces or other wiring on the package through which the address information is routed in a direction of the address bus of the package.

In this case, the flow of address information is through first segment 52A, through second segments 50 and 51 and then along first segment 52B. Stub 48 is shorter than stub 46 and may be less inductive such that stub 48 provides less loading to the address line 26 in FIG. 6B than the stub shown in FIG. 6A. In a further example shown in FIG. 6C, the stub length can be further reduced by having the jogs 53, 54 in the address lines each coupled to a bond pad 55 at a surface of the substrate, such bond pad 55 in turn being coupled with corresponding contacts 140 of the microelectronic element by a wire bond, e.g., a single wire bond 56. In yet another example shown in FIG. 6D, the stub length can be further reduced by having the jogs 63, 64 in the address lines each coupled to respective bond pads 57, 58 at a surface of the substrate, each such bond pad 57, 58 in turn being coupled with a corresponding contact 140 of the microelectronic element by a wire bond 59, such that there are two wire bonds forming a portion of the address line which includes the jogs 63, 64 and the bond pads 57, 58.

With the routing of address information as shown and discussed relative to FIG. 6A, 6B, 6C or 6D, it can be seen that the distance between the address inputs and the respective address lines can be reduced. In particular examples, the lengths of stubs in the examples of FIGS. 6A through 6C can be reduced to less than one millimeter, an in some cases to less than 0.5 millimeter, or even to less than 0.1 millimeter. It may also be provided that the distances between the contacts of the microelectronic elements used as address inputs and the respective first segments of address lines, e.g., first segments such as segment 26 (FIG. 6A), or similarly positioned first segments 52A, 52B (FIG. 6B) and the like, may in some cases be reduced to less than one millimeter, or in other examples, be reduced to less than 0.5 millimeter or less than 0.1 millimeter.

Figure 7A:
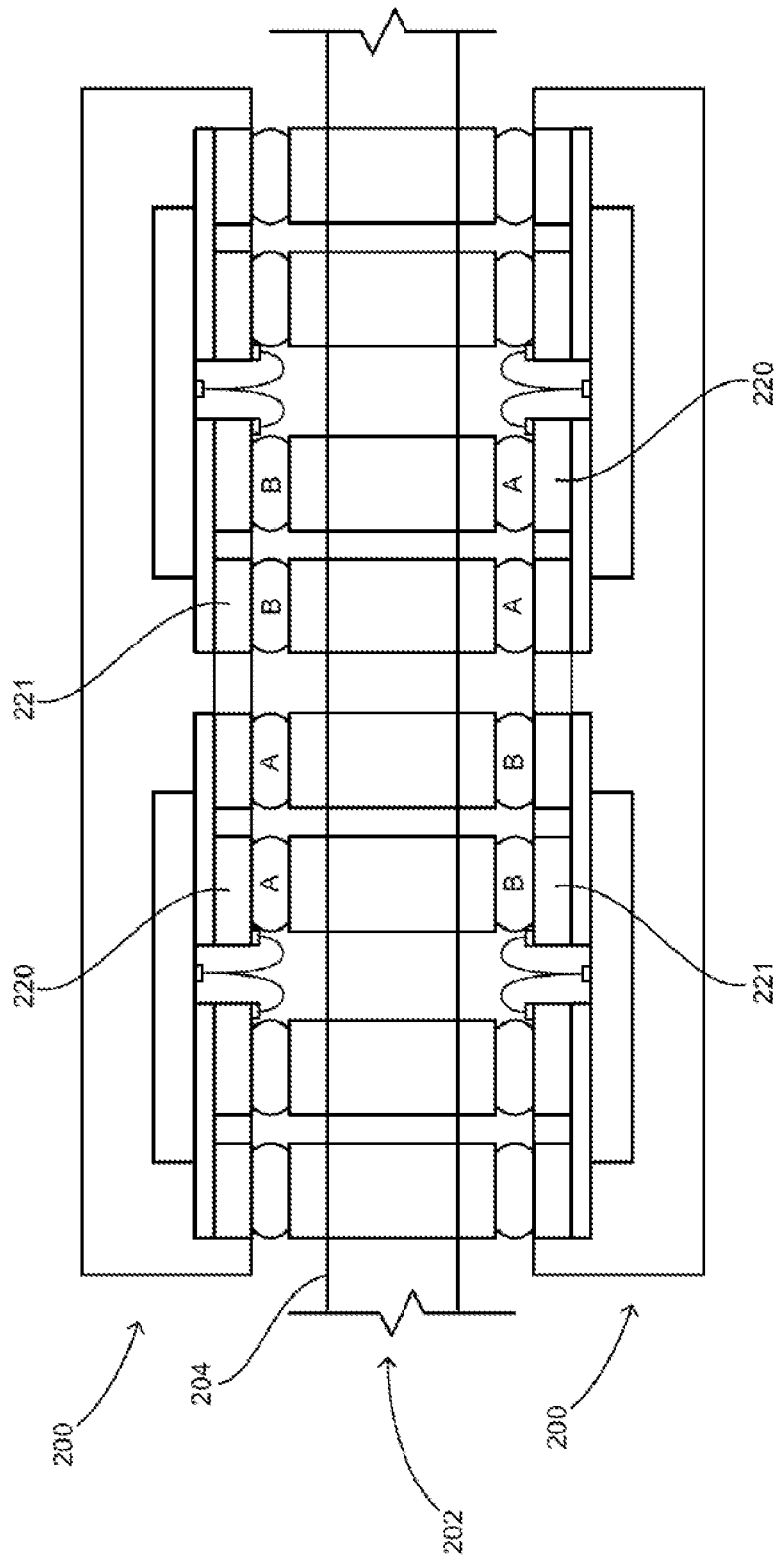
FIG. 7A is a sectional view illustrating an embodiment in which first and second multi-chip microelectronic packages according to an embodiment of the invention are arranged and interconnected together with a circuit panel in a clamshell configuration.

FIG. 7A illustrates a particular interconnection arrangement of packages 200 in accordance with an embodiment of the invention and a circuit panel or board 202, each package 200 being in accordance with one or more of the embodiments of the invention described above with reference to FIGS. 1A-1C, 2, 4A-4B, 5, and 6A-6D, for example. The arrangement seen in FIG. 7A can be referred to as a "clamshell" arrangement because the packages 200 overlie oppositely facing sides of the circuit panel 202 are aligned with the same area or nearly the same area of a surface 204 of the circuit panel 202 such that a set of first terminals 220 of the upper package 200 seen in FIG. 7A, having connections "A" to board 202 are aligned with corresponding second terminals 221 of the lower package 200 seen in FIG. 7A, which are shown having connections "B" to the board 202. Similarly, a set of second terminals 221 of the upper package 200 in FIG. 7A, having connections "B" to board 202 are aligned with corresponding first terminals 220 of the lower package 200 in FIG. 7A, which are shown having connections "A" to the board 202.

FIG. 7B further illustrates a possible "ballout" configuration of terminals at a surface of a package 200 which can be advantageously utilized within a clamshell arrangement of packages as seen in FIG. 7A. As shown therein, a set of first terminals 220 can include terminals configured to receive address information, e.g., having assignments A0 to A15 and BA0 to BA2. The first terminals may also be configured to receive other information such as a clock (CK) configured to sample the address information, and commands for input to the microelectronic elements such as write enable (WE), row address strobe (RAS), column address strobe (CAS), and possibly reference potentials such as VDD, etc. The second terminals 221 can be configured to carry all the same information as the first terminals. As seen in FIG. 7B, the signal assignments of the first terminals 220 can be mirror-symmetric with the signal assignments of the second terminals 221, such that, for example, the position of a first terminal 220 having the signal assignment A10 is symmetric about a theoretical axis 232 with a corresponding second terminal 221 which can have the same signal assignment "A10". These signal assignments seen in FIG. 7B such as "A10" correspond to the signal designations at contacts of microelectronic elements, e.g., microelectronic elements 110, 112, 114, 116, whether or not the terminals at the exterior surface of the package are given different names.

FIG. 7B further illustrates an arrangement of third terminals 224 at the exterior package surface which are configured to carry information other than the address information or the aforementioned commands WE, RAS, CAS, and sampling clock CK. For example, as seen in FIG. 7B, some or all of the third terminals 224 can also exhibit mirror symmetry about the theoretical axis 232 in the vertical package layout direction with fourth terminals 225, and some of all of a group of fifth terminals 226 can exhibit mirror symmetry about a second theoretical axis 234 extending in a horizontal package layout direction with sixth terminals 227.

Figure 8:
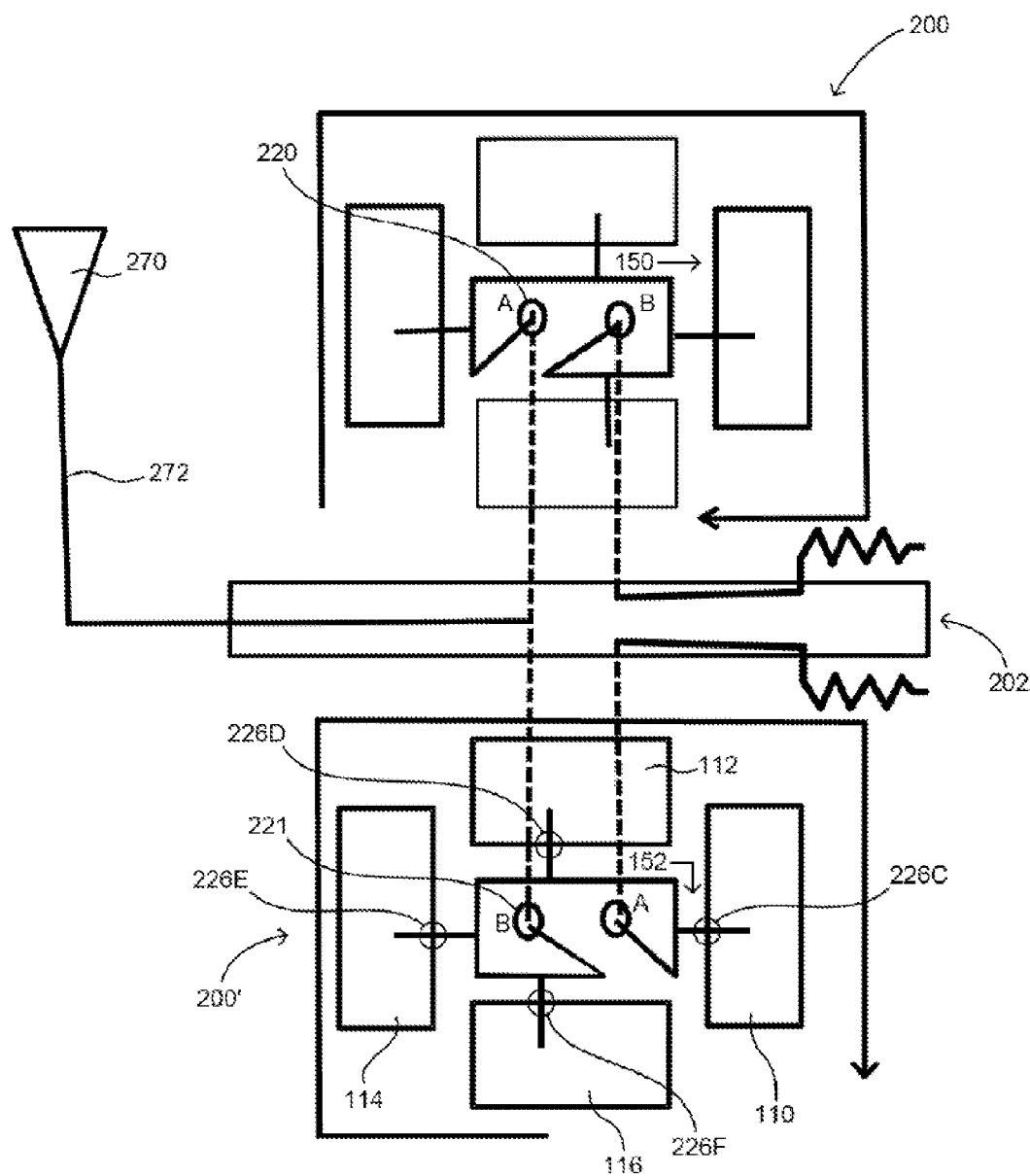
FIG. 8 is a schematic diagram further illustrating a clamshell arrangement of multi-chip packages as interconnected in a system.

A clamshell interconnection arrangement of packages 200, 200' within a system 208 is further shown schematically in FIG. 8. As seen therein, a driver 270 is configured to drive address information on an address line 272 to a first terminal 220 referenced "A" coupled thereto of the upper package 200 seen in FIG. 8, and also on the address line 272 to a second terminal 221 referenced "B" coupled thereto of the lower package 200' as seen in FIG. 8. Once the address information is received at these terminals 220 of the upper package, and 221 of the lower package, the address information flows along address lines in direction 150 within the upper package 200 and flows along address lines in the lower package 200' in direction 152, so as to pass through each of the connection regions coupled to microelectronic elements in each package. In this case, the flow of the address information in the lower package 200' is from second terminals (represented by second terminal 221) through a connection region 226F coupled to microelectronic element 116, then through connection region 226E coupled to microelectronic element 114, then through connection region 226D coupled to microelectronic element 112, and then through connection region 226C coupled to microelectronic element 110.

In this case, it can be beneficial for the clamshell arrangement if each individual package is configured such that the first delay along the address lines in a first electrical path direction from the first terminals to the first connection region is the same as the delay along the address lines from the second terminals to the connection region 126F adjacent thereto in a second electrical path direction opposite the first electrical path direction. This arrangement can also be true of the second delay along the address lines in the first electrical path direction from first terminals to the second connection region 126D, being the same as a delay along the address lines in the second electrical path direction from second terminals the connection region 126E.

Figure 9:
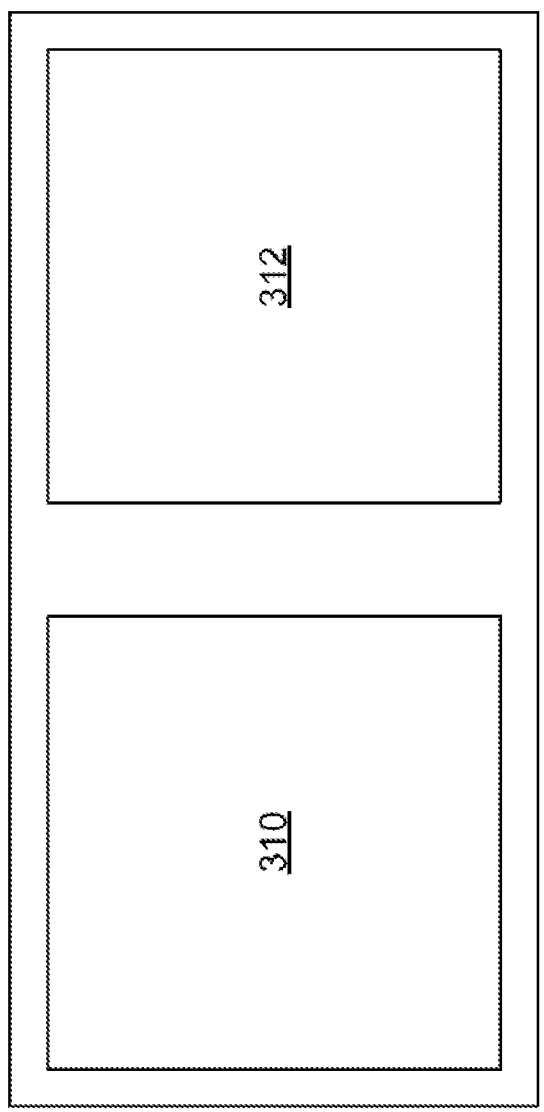
FIG. 9 is a top plan view of a multi-chip package according to an embodiment of the invention.

FIG. 9 illustrates a variation of the above-described embodiments in which a package 300 may contain only two microelectronic elements, which can be referred to as first and second microelectronic elements. In this case, the structure and operation can be the same as described in each of the above-described embodiments and variations, with the exception that there are only first and second connection regions of the address lines between the first and second sets of terminals, which are coupled to the first and second microelectronic elements, respectively. A typical flow of address information within the package is from first terminals as received thereon, to a first connection region where the address lines are coupled to the first microelectronic element 310, and then from the first connection region to a second connection region wherein the address lines are coupled to the second microelectronic element 312, and then to the second terminals of the package 300.

Figure 10:
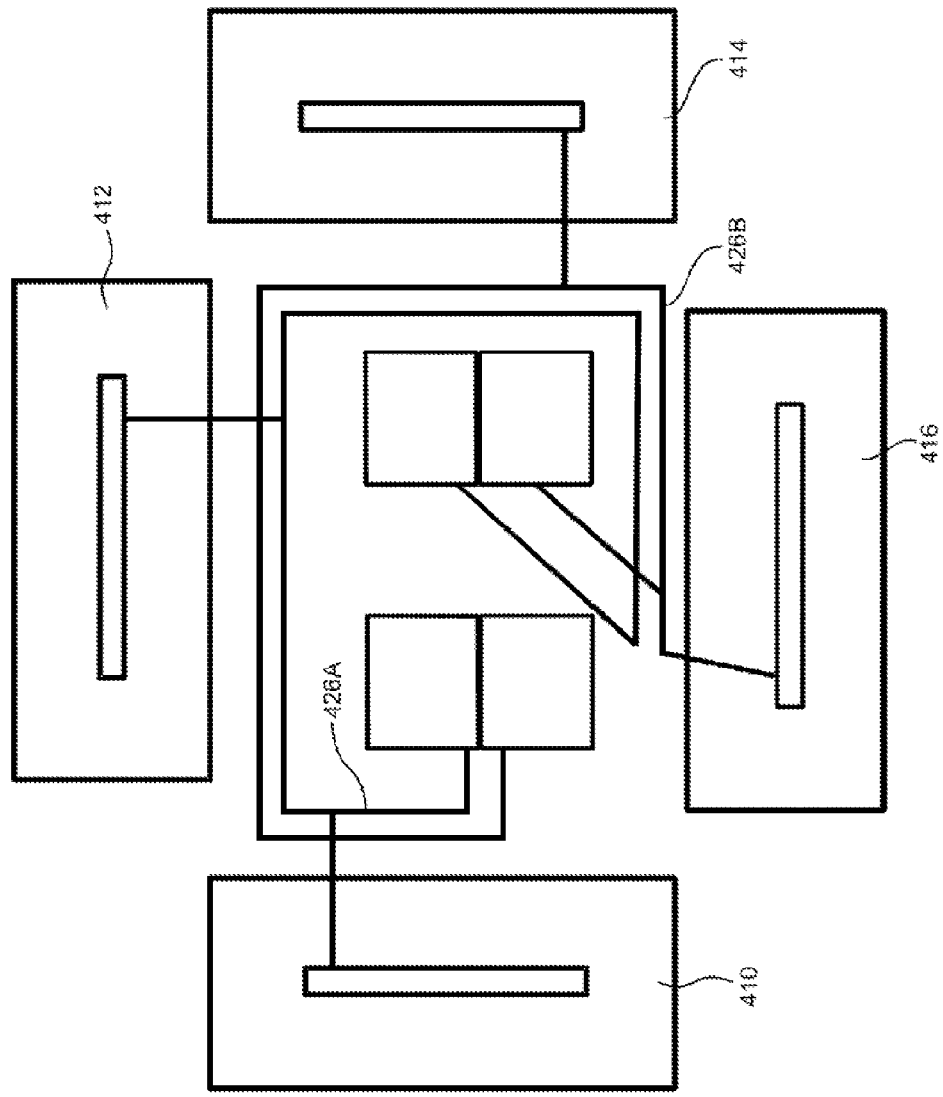
FIG. 10 is a plan diagram illustrating a possible arrangement of address lines in a multi-chip microelectronic package according to a variation of an embodiment of the invention seen in FIGS. 1A-1C and 2.

FIG. 10 illustrates an embodiment in accordance with a particular variation of the embodiment described above relative to FIGS. 1A-C and 2. In this embodiment, each microelectronic element can of a type which utilizes a smaller number of address inputs (than in the above examples) for receiving address information needed to specify a storage location within such microelectronic element. Thus, the microelectronic elements 410, 412, 414, and 416 may of type LPDDRx in which such microelectronic elements are configured to receive multiplexed address information or multiplexed address and command information as sampled thereon at a rate of at least twice per clock cycle for at least some clock cycles during operation. This differs from that of other types of memory such as DDRx in which address information and command information typically are sampled at a rate of once per clock cycle. In view of such arrangement, these particular type of microelectronic elements 410, 412, 414, 416 may need to be coupled only with some of the address lines which can be provided on the package substrate. Therefore, in the arrangement seen in FIG. 10, microelectronic elements 410 and 412 are coupled with a first set of address lines 426A, and microelectronic elements 414 and 416 are coupled with a second set of address lines 426B.

In yet another variation, microelectronic elements in the package can include redistribution structures thereon, such as used to redistribute the contacts of the microelectronic element to second locations as bond pads usable for wire-bonding thereto, for example.

In yet another variation, any of the packages described in the foregoing can be implemented as a "wafer-level package," "wafer process package," or the like. In such example, the address lines can be electrically conductive traces, e.g., plated or etched metal traces or of other electrically conductive material disposed on a dielectric layer of the package which overlies the faces of the microelectronic elements, and through which dielectric layer metalized vias may extend which couple the traces with contacts of the microelectronic elements.

The packages described herein may include other features such as overmolds or other encapsulant material overlying the faces of the microelectronic elements which face away from the package substrate. A heat spreader may alternatively be provided or may also be provided overlying such faces of the microelectronic elements.

In a "wafer-level package" traces such as address lines and other electrically conductive structure may extend beyond edges of the microelectronic elements to areas overlying a surface of an overmold or encapsulant material which may lie in a common plane with the contact-bearing faces of the microelectronic elements. In such package, in one example, at least some of the terminals may overlie the surface of the overmold or encapsulant material. In one example, at least some of the terminals may overlie the faces of the microelectronic elements.

Referring to FIG. 1C, in yet another variation, the contacts of the microelectronic elements 110, 112, 114, and 116 having memory storage arrays thereon, particularly semiconductor chips, may face and be joined with corresponding contacts of the substrate, such contacts provided at surface 102 of the substrate.

Figure 11:
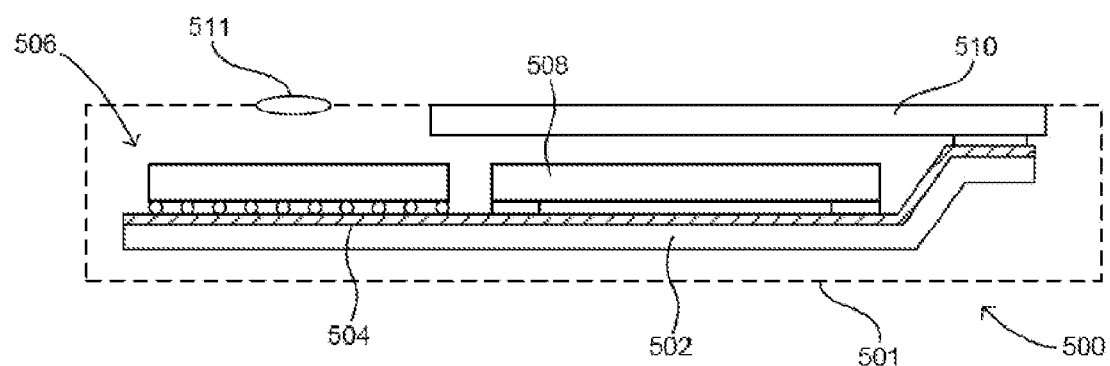
FIG. 11 is a schematic diagram illustrating a system according to an embodiment of the invention.

The structures discussed above provide extraordinary three-dimensional interconnection capabilities. These capabilities can be used with chips of any type. The structures discussed above can be utilized in construction of diverse electronic systems. For example, a system 500 in accordance with a further embodiment of the invention includes a structure 506 as described above in conjunction with other electronic components 508 and 510. In the example depicted, component 508 is a semiconductor chip whereas component 510 is a display screen, but any other components can be used. Of course, although only two additional components are depicted in FIG. 11 for clarity of illustration, the system may include any number of such components. The structure 506 as described above may be, for example, any of the microelectronic packages discussed above. Structure 506 and components 508 and 510 are mounted in a common housing 501, schematically depicted in broken lines, and are electrically interconnected with one another as necessary to form the desired circuit. In the exemplary system shown, the system includes a circuit panel 502 such as a flexible printed circuit board, and the circuit panel includes numerous conductors 504, of which only one is depicted in FIG. 11, interconnecting the components with one another. However, this is merely exemplary; any suitable structure for making electrical connections can be used. The housing 501 is depicted as a portable housing of the type usable, for example, in a smart phone or other cellular telephone, tablet computer, or notebook computer, for example, and screen 510 is exposed at the surface of the housing. Where structure 506 includes a light-sensitive element such as an imaging chip, a lens 511 or other optical device also may be provided for routing light to the structure. Again, the simplified system shown in FIG. 11 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention as defined by the claims.

What is claimed is:

1. A microelectronic package, comprising:
a package substrate having first and second oppositely facing surfaces, a plurality of first terminals at the second surface of the package substrate and configured for connection with a component external to the package, the plurality of first terminals configured to carry address information; and
first and second microelectronic elements each having a first face confronting the first surface of the substrate, each microelectronic element including a memory storage array, and each microelectronic element having address inputs for receipt of address information specifying locations within the memory storage array of the respective microelectronic element,
the package substrate further having a plurality of address lines electrically connected with the plurality of first terminals and configured to carry address information to a first connection region on the substrate, the first connection region having a first delay from the plurality of first terminals, the address lines being configured to carry the address information beyond the first connection region at least to a second connection region on the substrate having a second delay from the plurality of first terminals, wherein the address inputs of the first microelectronic element are coupled with each of the plurality of address lines at the first connection region, and the address inputs of the second microelectronic element are coupled with each of the plurality of address lines at the second connection region, wherein the second delay is greater than the first delay; and
an encapsulant material overlying second faces of the first and second microelectronic elements that face away from the package substrate.

2. The microelectronic package as claimed in claim 1, wherein the address inputs of the first microelectronic element are disposed at positions within a row extending in a first direction, wherein first segments of the plurality of address lines adjacent to the first microelectronic element extend in the first direction.

3. The microelectronic package as claimed in claim 2, wherein at least some of the first segments overlie the first face of the first microelectronic element.

4. The microelectronic package as claimed in claim 2, wherein the segments of the plurality of address lines are the first segments, and second segments of the plurality of address lines extend in a second direction away from the first segments towards the address inputs of the first microelectronic element, each second segment having length less than half a width of the microelectronic element.

5. The microelectronic package as claimed in claim 1, wherein the first and second microelectronic elements are spaced apart from one another in a direction parallel to the first surface.

6. The microelectronic package as claimed in claim 1, wherein the second faces of the first and second microelectronic elements at which the address inputs are provided, respectively, are arranged in a single plane.

7. A system including a microelectronic package as claimed in claim 1, further comprising a housing and a circuit panel having contacts electrically connected with the plurality of first terminals.

8. The microelectronic package as claimed in claim 1, wherein each microelectronic element is a bare semiconductor chip.

9. The microelectronic package as claimed in claim 1, wherein each microelectronic element is a semiconductor chip having contacts thereon and a redistribution layer having a plurality of redistribution contacts at a surface facing away from the semiconductor chip that are electrically coupled with the contacts of the semiconductor chip through conductors extending parallel to at least a portion of a face of the semiconductor chip.

10. A microelectronic package, comprising:
a package substrate having a plurality of first terminals for connection with a component external to the package, the plurality of first terminals configured to carry address information; and
first and second microelectronic elements each having a face confronting a first surface of the substrate, each microelectronic element including a memory storage array, and each microelectronic element having address inputs for receipt of address information specifying locations within the memory storage array of the respective microelectronic element,
the package substrate further having a plurality of address lines electrically connected with the plurality of first terminals and configured to carry address information to a first connection region on the substrate, the first connection region having a first delay from the plurality of first terminals, the address lines being configured to carry the address information beyond the first connection region at least to a second connection region on the substrate having a second delay from the plurality of first terminals, wherein the address inputs of the first microelectronic element are coupled with each of the plurality of address lines at the first connection region, and the address inputs of the second microelectronic element are coupled with each of the plurality of address lines at the second connection region, wherein the second delay is greater than the first delay,
wherein the first microelectronic element includes a row of contacts thereon comprising at least some of the address inputs of the first microelectronic element, and wherein segments of the address lines at the first connection region on the substrate extend in a first direction parallel to a direction in which the row of contacts on the first microelectronic element extends.

11. The microelectronic package as claimed in claim 10, wherein the second microelectronic element includes a row of contacts thereon comprising at least some of the address inputs of the second microelectronic element, and wherein segments of the address lines at the second connection region on the substrate extend in a second direction parallel to a direction in which the row of contacts on the second microelectronic element extends.

12. The microelectronic package as claimed in claim 11, wherein the first direction is perpendicular to the second direction.

13. The microelectronic package as claimed in claim 10, further comprising:
third and fourth microelectronic elements each having a face confronting the first surface of the substrate, each of the third and fourth microelectronic elements including a memory storage array, and each of the third and fourth microelectronic elements having address inputs for receipt of address information specifying locations within the memory storage array of the respective microelectronic element, wherein the third and fourth microelectronic elements each includes a row of contacts thereon comprising at least some of the address inputs of the respective microelectronic element,
wherein the plurality of address lines are configured to carry address information to a third connection region on the substrate, the third connection region having a third delay from the plurality of first terminals, the address lines being configured to carry the address information beyond the third connection region to a fourth connection region on the substrate having a fourth delay from the plurality of first terminals, wherein the address inputs of the third microelectronic element are coupled with each of the plurality of address lines at the third connection region, and the address inputs of the fourth microelectronic element are coupled with each of the plurality of address lines at the fourth connection region, wherein the fourth delay is greater than the third delay,
wherein segments of the address lines at the third connection region on the substrate extend in a third direction parallel to a direction in which the row of contacts on the third microelectronic element extends, and
wherein segments of the address lines at the fourth connection region on the substrate extend in a fourth direction parallel to a direction in which the row of contacts on the fourth microelectronic element extends.

14. The microelectronic package as claimed in claim 10, wherein each microelectronic element is a bare semiconductor chip.

15. The microelectronic package as claimed in claim 10, wherein each microelectronic element is a semiconductor chip having contacts thereon and a redistribution layer having a plurality of redistribution contacts at a surface facing away from the semiconductor chip that are electrically coupled with the contacts of the semiconductor chip through conductors extending parallel to at least a portion of a face of the semiconductor chip.

16. A microelectronic assembly, comprising:
first and second microelectronic packages, each having:
a package substrate having a plurality of first terminals for connection with a component external to the package, the plurality of first terminals configured to carry address information; and
first and second microelectronic elements each having a face confronting a first surface of the substrate, each microelectronic element including a memory storage array, and each microelectronic element having address inputs for receipt of address information specifying locations within the memory storage array of the respective microelectronic element,
the package substrate further having a plurality of address lines electrically connected with the plurality of first terminals and configured to carry address information to a first connection region on the substrate, the first connection region having a first delay from the plurality of first terminals, the address lines being configured to carry the address information beyond the first connection region at least to a second connection region on the substrate having a second delay from the plurality of first terminals, wherein the address inputs of the first microelectronic element are coupled with each of the plurality of address lines at the first connection region, and the address inputs of the second microelectronic element are coupled with each of the plurality of address lines at the second connection region, wherein the second delay is greater than the first delay; and
a circuit panel having a first surface and a first set of connections thereat with the first microelectronic package, and having a second surface opposite the first surface and a second set of connections thereat with the second microelectronic package.

17. The microelectronic package as claimed in claim 16, wherein a plurality of the first terminals of the first microelectronic package are aligned a plurality of corresponding second terminals of the second microelectronic package, and a plurality of the second terminals of the first microelectronic package are aligned a plurality of corresponding first terminals of the second microelectronic package.

18. The microelectronic package as claimed in claim 16, wherein signal assignments of the plurality of first terminals of each microelectronic package are symmetric about a theoretical axis with signal assignments of the plurality of second terminals of the same microelectronic package.

19. The microelectronic package as claimed in claim 16, wherein each microelectronic element of at least one of the first and second microelectronic packages is a bare semiconductor chip.

20. The microelectronic package as claimed in claim 16, wherein each microelectronic element of at least one of the first and second microelectronic packages is a semiconductor chip having contacts thereon and a redistribution layer having a plurality of redistribution contacts at a surface facing away from the semiconductor chip that are electrically coupled with the contacts of the semiconductor chip through conductors extending parallel to at least a portion of a face of the semiconductor chip.

* * * * *